US011169178B2

(12) United States Patent
Ouyang et al.

(10) Patent No.: US 11,169,178 B2
(45) Date of Patent: Nov. 9, 2021

(54) LOCKING MECHANISM FOR A PRESS HEAD AND ELECTRONIC DEVICE TESTING APPARATUS COMPRISING THE SAME

(71) Applicant: Chroma Ate Inc., Taoyuan (TW)

(72) Inventors: Chin-Yi Ouyang, Taoyuan (TW); Chien-Ming Chen, Taoyuan (TW); Bo-An Su, Taoyuan (TW); Yu-Hsuen Wang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 17/023,445

(22) Filed: Sep. 17, 2020

(65) Prior Publication Data

US 2021/0199690 A1    Jul. 1, 2021

(30) Foreign Application Priority Data

Dec. 27, 2019   (TW) .................................. 108148006

(51) Int. Cl.
*G01R 1/04*         (2006.01)
(52) U.S. Cl.
CPC .................................. *G01R 1/0466* (2013.01)

(58) Field of Classification Search
CPC ................................................... G01R 1/0466
See application file for complete search history.

(56) References Cited

U.S. PATENT DOCUMENTS

2010/0311264 A1* 12/2010 Chen .................... H01R 13/193
                                                                439/330
2017/0292973 A1* 10/2017 Chen ................ H01R 13/62905

* cited by examiner

*Primary Examiner* — Paresh Patel
(74) *Attorney, Agent, or Firm* — McClure, Qualey & Rodack, LLP

(57) ABSTRACT

The present invention relates to a locking mechanism for a press head, and an electronic device testing apparatus comprising the same, wherein a slider and a locking pin are disposed on the press head and a test socket substrate, respectively. When the press head is moved and engaged with the test socket substrate, an actuator drives the slider to secure the locking pin, so as to secure the press head and the test socket substrate and prevent the press head and the test socket substrate from being separated from each other. The mechanism is simple in construction, easy to install and maintain, reliable, and can be integrated into the support arms, and occupies a relatively small space. Energy is consumed only when the actuator is actuated to effect locking or unlocking. That is, only when the slider is driven and moved, energy is consumed. No extra energy is needed to persistently press down or drive the locking mechanism.

10 Claims, 4 Drawing Sheets

LOCKING MECHANISM FOR A PRESS HEAD AND ELECTRONIC DEVICE TESTING APPARATUS COMPRISING THE SAME

BACKGROUND OF THE INVENTION

1. Field of the Invention

The present invention relates to a locking mechanism for a press head and an electronic device testing apparatus provided with the same, in particular to an electronic device testing apparatus that can apply a specific pressing force, and is suitable for detecting the qualities of electronic components.

2. Description of the Related Art

With development of semiconductor technology, the functions and computing power of a single chip are becoming more and more powerful. As such, the number of contacts or pins needed for the chips grows tremendously. At the current state of the art, the cross-sectional area of some chips is as large as 10 square centimeters, and the associated contacts or pins amount to thousands or even tens of thousands.

When testing these chips, in order to ensure sufficient electrical contact between the chip and the pogo pins, the apparatus should be capable of exerting a sufficient pressing force. As a pogo pin generally has a spring force of about 25 to 35 gf, to meet the testing specifications of the art, the apparatus should apply a pressing force of at least 300 Kgf to overcome the spring force of the pogo springs, so that each of the contacts of the chips is in sufficient electrical connection with each corresponding pogo spring. In order to cope with such a large pressing force and the associated reaction force, the apparatus needs to provide an additional locking mechanism.

The aforementioned locking mechanism can be best understood by referring to US Patent Publication No. 2017/0292973 (A1) entitled "Electronic device testing apparatus with locking mechanism for pressing header and socket plate", owned by the Applicant. This publication discloses a plurality of mechanisms for locking the press head and socket plate. However, most of them are directed to one having a single driving power source that actuates a two-stage pressing operation. That is to say, when the press head descends to contact the chip, the locking mechanism is not yet actuated. Only when the press head is further downwardly pressed, the locking mechanism is driven synchronously.

The afore-mentioned prior art is disadvantageous in that the mechanism is bulky, complicated to assembly, and high in manufacturing cost. Furthermore, it is unable to confirm if the locking mechanism is locked or released instantly, and so sensors have to be further installed for detecting the operation of the locking mechanism. In addition, some chip testing needs tens of hours or even days to process. As locking mechanism of the known type is in a locked state, the driving source has to persistently press the pressing head downward. Consequently, not only a considerable amount of energy is wasted, but also the additional pressing force can easily cause fatigue of the materials, thereby reducing the life span of the machine.

SUMMARY OF THE INVENTION

The primary object of the present invention is to provide a locking mechanism for the press head and an electronic device testing apparatus comprising the locking mechanism. The mechanism according to the present invention is simple in construction and operation, not costly in installation and maintenance, and occupies a relatively small space. Further, when the locking mechanism of the invention is in a locked state, no extra energy is needed to persistently press or drive the locking mechanism.

In order to achieve the above object, the present invention provides a press head locking mechanism for locking the press head and the test socket substrate, the locking mechanism mainly includes an actuator, slider, and locking pin disposed on at least one of the press head and the test socket substrate; wherein, when the press head is engaged with the test socket substrate, the actuator drives the slider to slide in a specific direction to secure the locking pin, so that the press head and the test socket substrate cannot be separated from each other.

As mentioned above, the slider and the locking pin are disposed on the press head and the test socket substrate, respectively. When the press head is to be locked on the test socket substrate, the actuator is actuated to drive the slider to secure the locking pin, to secure the press head and the test socket substrate to prevent separation from each other. Accordingly, the mechanism according to the present invention is simple and reliable, easy to assemble and maintain. The mechanism will consume energy only when the actuator is triggered to effect locking or unlocking (that is only when the slider is displaced by the action of the actuator). It is not necessary to persistently activate the actuator.

In order to achieve the foregoing objective, an electronic device testing apparatus having a press head locking mechanism of the present invention mainly includes a test socket substrate, a press head, and a pair of press head locking mechanisms. The test socket substrate has a test socket slot. The press head includes a first support arm and a second support arm, and the first support arm and the second support arm correspond to two corresponding sides of the test socket slot. Each press head locking mechanism is provided on at least one of the first support arm, the second support arm, and the test socket substrate. Each press head locking mechanism includes an actuator, a slider, and a locking pin. When the press head is engaged with the test socket substrate, the actuator drives the slider to move in a predetermined direction to secure the locking pin, whereby the press head and the test socket substrate are securely locked to prevent separation from each other.

Specifically, according to the present invention, some parts of the press head locking mechanism are placed in the support arms of the press head. For example, the actuator and the slider are integrated into the support arms, while the locking pins are mounted on the test socket substrate. When locking is to be performed, the actuator drives the slider to allow the slider to secure the locking pin. Thereby, even when the pressure generating device generates a pressing force to press the chip to be tested, the press head and the test socket substrate are not affected by the pressing force, and they will not be separated from each other.

DESCRIPTION OF THE PREFERRED EMBODIMENTS

Figure 1:
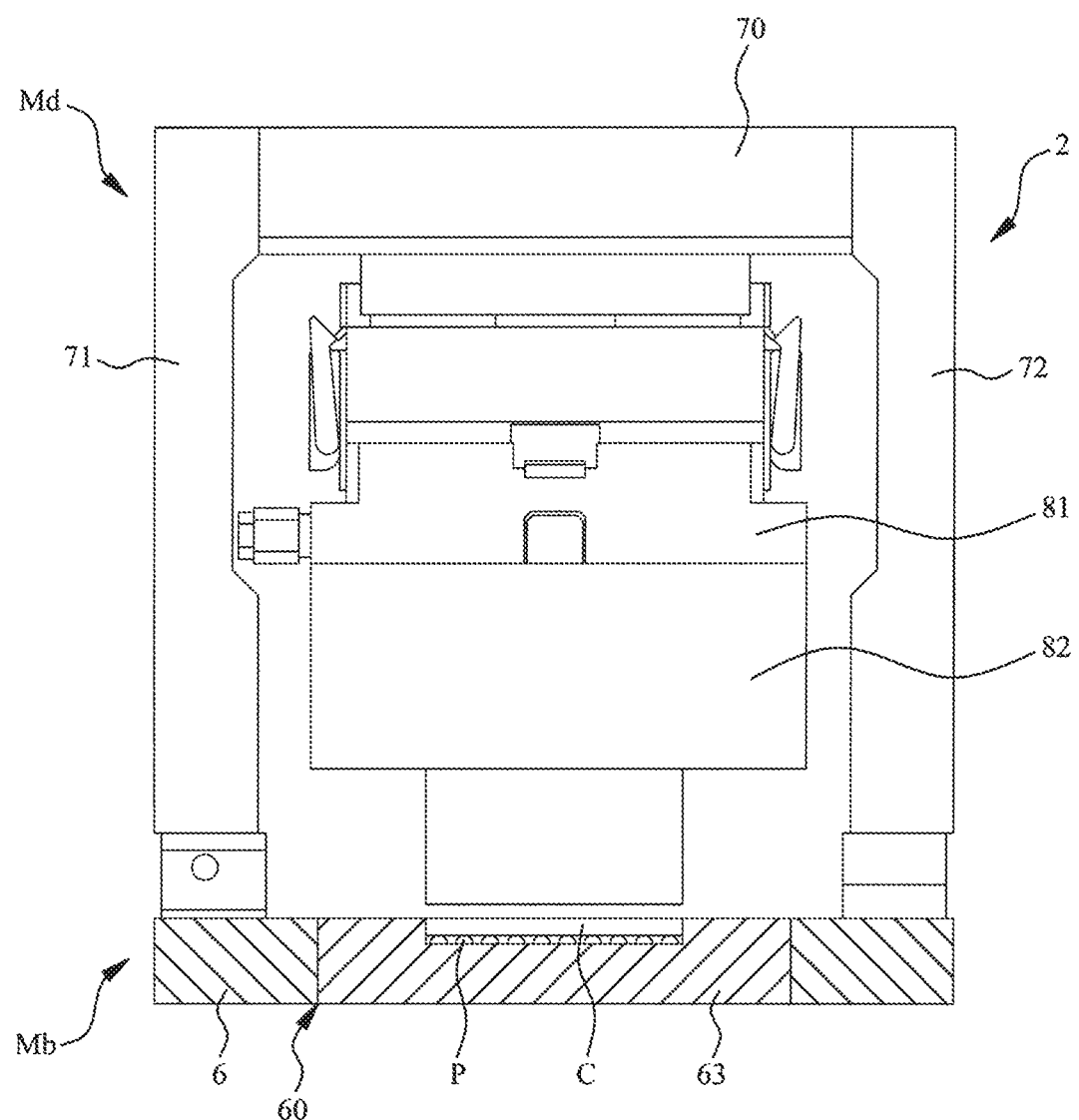
FIG. 1 is a schematic view illustrating a preferred embodiment of an electronic device testing apparatus having a press head locking mechanism according to the present invention.

The present invention is related to a locking mechanism for a press bead and an electronic device testing apparatus comprising the locking mechanism. In the description, similar elements will be denoted by the same reference numerals. In addition, the drawings of the present invention are only intended to be illustrative, and are not necessarily drawn to scale, and all details are not necessarily be shown in the drawings.

FIG. 1 is a schematic view illustrating a preferred embodiment of an electronic device testing apparatus having a press head locking mechanism according to the present invention. As shown in the figure, the testing apparatus of this embodiment mainly includes a pressing zone Md and a base zone Mb. The pressing zone Md not only serves to press the electronic component/device C, but also serves to pick and place the electronic component C. In some alternate embodiments, the pressing zone Md has to serve to heat or cool the electronic component C. The base zone Mb is primarily used to receive the electronic component C for testing.

In this embodiment, the pressing zone Md is mainly composed of a lower pressing head 2 that includes a top plate 70, a first support arm 71, a second support arm 72, a pressure generating device 81, and a press-fit block 82. The top plate 70 is connected to a lifting mechanism (not shown), and the first and second support arms 71, 72 are located on both sides of the top plate 70. The pressure generating device 81 is coupled to the top plate 70 and is located between the first and second support arms 71, 72. The press-fit block 82 is connected to and located underneath the pressure generating device 81. The pressure generating device 81 is used to generate a pressing force, and the press-fit block 82 is used to transfer the pressing force. That is to say, the press-fit block 82 can be driven to press the electronic component C to be tested so as to exert the pressing force onto the electronic component C.

The base zone Mb of this embodiment mainly includes a test socket substrate 6 and a test socket slot 60. Although other components are not shown in the figure, those skilled in the art could easily conceive that the base zone may further comprise, for example, a test board, a support plate, and a T-bar. The test socket slot 60 is intended to receive the test socket 63 which provides an electrical interface so that the electronic component C is electrically connected to a tester for testing. The electrical interface comprises a probe P at the bottom of the test socket 63, which is electrically connected to the contact on the bottom surface of the electronic component C (not shown).

Figure 2:
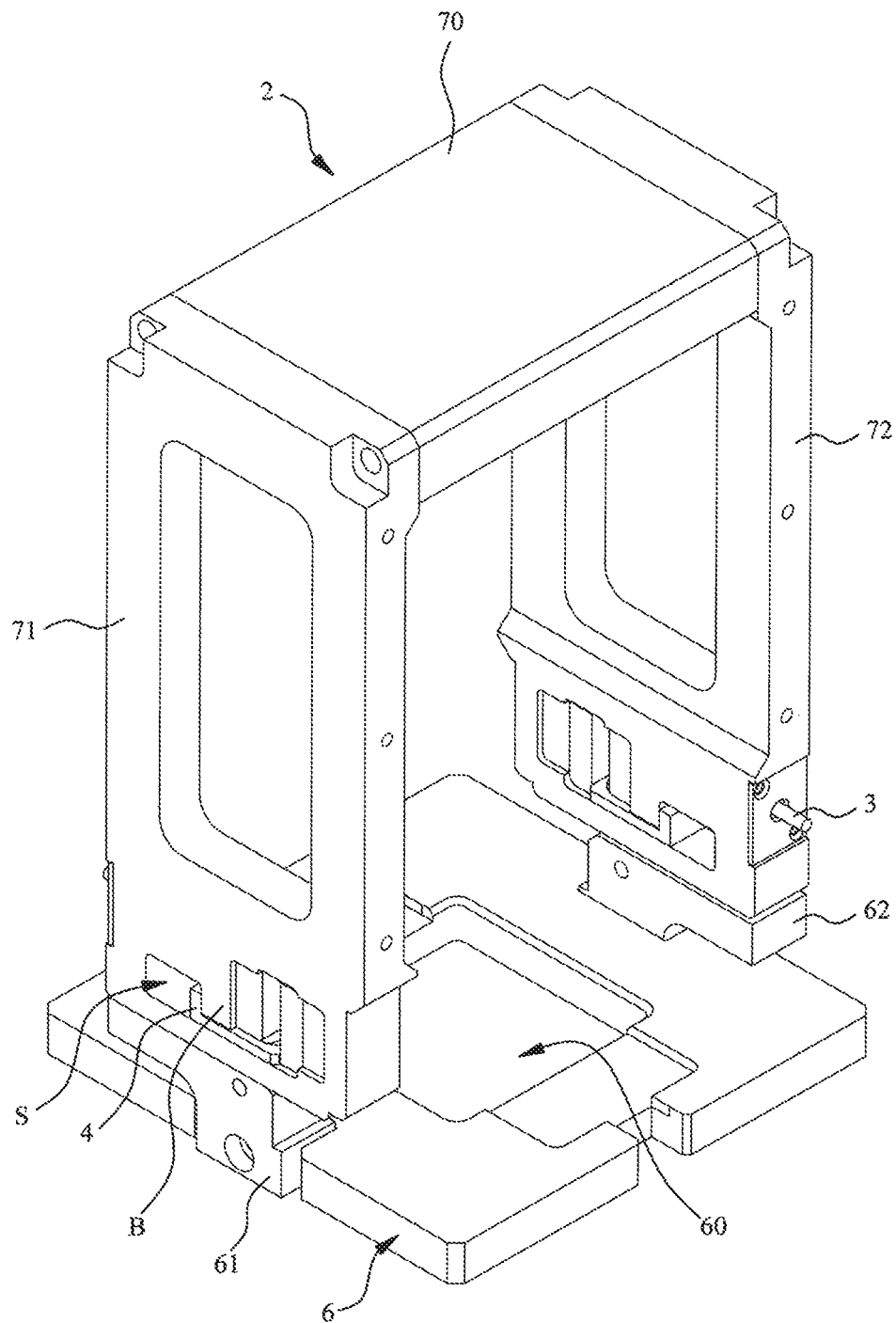
FIG. 2 is a perspective view showing the press head and test socket substrate according to a preferred embodiment of the present invention.
Figure 3:
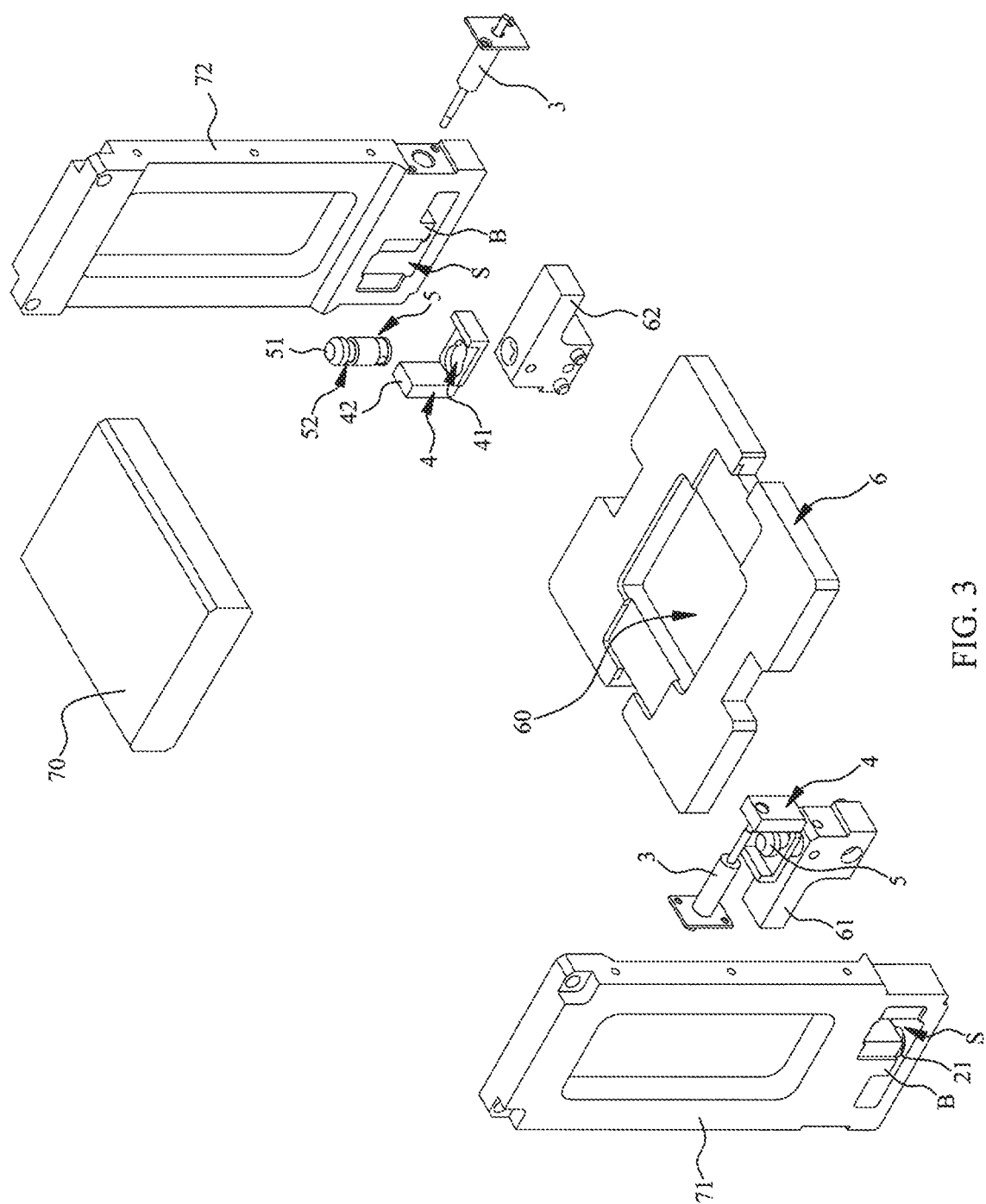
FIG. 3 is an exploded view of the press head and test socket substrate according to a preferred embodiment of the present invention.
Figure 4A:
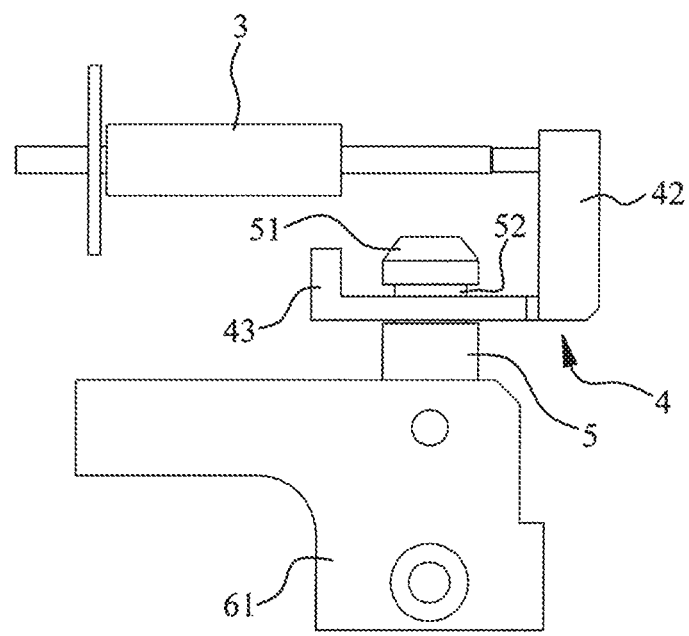
FIG. 4A is a schematic view showing the locking mechanism for the press head according to a preferred embodiment of the present invention.

Reference is made to FIGS. 2, 3 and 4A, in which FIG. 2 is a perspective view showing the press head 2 and test socket substrate 6 according to a preferred embodiment of the present invention, FIG. 3 is an exploded view of the press head 2 and test socket substrate 6 according to a preferred embodiment of the present invention, and FIG. 4A is a schematic view showing the locking mechanism for the press head according to a preferred embodiment of the present invention. As shown in the figures, the press head locking mechanism of this embodiment mainly includes an actuator 3, a slider 4, and a locking pin 5. The first support arm 71 and the second support arm 72 are provided with an actuator 3 and a slider 4, respectively, and a locking pin 5 is fixed on the test socket substrate 6. In this embodiment, the actuator 3 comprises a pneumatic cylinder, but the present invention is not limited to this embodiment. Other mechanisms or devices that may provide a reciprocating linear motion, for example a linear motor, can also be suitable for this invention.

Each of the first and second support arms 71 and 72 includes an accommodating space S, an insertion hole 21, and a locking part B. The accommodating space S is an internal cavity within which the actuator 3 and the slider 4 are disposed. Each of the first and second support arms 71 and 72 has an insertion hole 21 provided at the lower surface thereof. The insertion hole 21 is in communication with the accommodating space S. The locking part B protrudes downward from the upper side of the accommodating space S. and is configured to stop and position the slider 4.

Figure 4B:
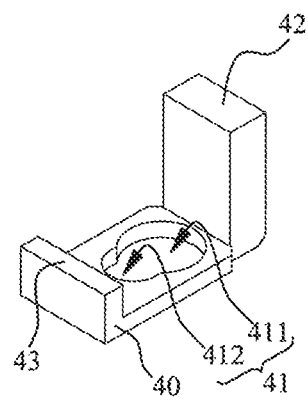
FIG. 4B is a perspective view of a slider according to a preferred embodiment of the present invention.

FIG. 4B is a perspective view of a slider 4 according to a preferred embodiment of the present invention. The slider 4 comprises a bottom plate 40, a push block 42, and a stop block 43. The push block 42 and the stop block 43 are located on both sides of the bottom plate 40. The bottom plate 40 is provided with a slot 41 that is composed of a large circular hole 411 and a small circular hole 412 in communication with each other.

The test socket substrate 6 of this embodiment includes a test socket slot 60, a first protrusion 61, and a second protrusion 62. The test socket slot 60 is structured to receive a test socket (not shown). The first and second protrusions 61 and 62 are opposed to each other and mounted on the test socket substrate 6, with the test socket slot 60 being located between them. The first and second protrusions 61 and 62 are each provided with a locking pin 5. In addition, the locking pin 5 of this embodiment includes a head portion 51 and a neck portion 52.

The operation of this preferred embodiment is described below with reference to all the afore-mentioned figures. After the electronic component has been placed in the test socket 63, the press head 2 begins to press down. Then, the locking pin 5 is inserted into the insertion hole 21 located at the lower surface of the support arm 71, 72; wherein the push block 42 of the slider 4 abuts the locking part B. Now, the locking pin 5 is aligned with the large circular hole 411 of the slider 4, and may pass through the large circular hole 411 as the diameter of the large circular hole 411 is larger than the head portion 51 of the head portion 51 of the locking pin 5.

To lock the press head 2 and the test socket substrate 6, the actuator 3 is actuated to drive the slider 4 to slide. When the locking part B stops the stop block 43, the small circular hole 412 of the slider 4 may well receive the neck portion 52 of the locking pin 5. That is to say, the locking pin 5 will be securely locked within the slot 41 of the slider 4. At this instant, the press head 2 and the test socket substrate 6 are secured locked and cannot be detached from each other. After the pressure generating device 81 has exerted a pressing force onto the electronic component C, a test can then be performed.

Once the test is finished, the actuator 3 again drives the slider 4 to slide until the push block 42 is stopped by the locking part B. Likewise, the large circular hole 411 of the slider 4 now receives the locking pin 5 which can freely pass through the large circular hole 411. That is to say, the press head 2 and the test socket substrate 6 can be easily separated from each other.

It is to be noted that when the pressure generating device 81 exerts a pressing force onto the electronic component C, the entire press head locking mechanism achieves internal force equilibrium. A simulation analysis shows that when a pressing force of 300 kgf is exerted, the first support arm 71 and the second support arm 72 each bear an internal stress of 150 kgf, with the maximum variance being only 0.034 mm, which occurs at the junctions between the top plate 70 and the first and second support arms 71, 72. It is thus apparent that the press head locking mechanism according to this embodiment may achieve internal force equilibrium, and the amount of deformation is considerably small even subjected to a considerable pressing force.

In view of the above, the present invention may provide at least the following advantages:

1. The press head locking mechanism according to the present invention is simple in construction, easy to install and maintain, low-cost in manufacturing, reliable and high in industrialization value.
2. The press head locking mechanism according to the present invention can be integrated to the support arms on both sides of the press head, and thus occupies only a small volume and the space of the machine may be utilized to its maximum extent.
3. The present invention will drive the slider by means of the actuator only when locking or unlocking is triggered. That is, the actuator is in a standby state during or before the test, and no external power source is required to maintain the locking. As such, energy consumption is greatly reduced.
4. Compared with the single power source as mentioned in the background art, the present invention does not require any external force (a pressing force) to maintain the locking. As such, the influence of complicated stresses caused by the external pressing force is reduced, thereby reducing the fatigue effects of the machine components resulted by internal forces and prolonging the service life.
5. The press head locking mechanism according to the present invention may achieve internal force equilibrium, which can significantly reduce the influence of huge pressing force on other mechanisms or components of the entire test equipment, and the amount of deformation is considerably small.

The preferred embodiments of the present invention are illustrative only, and the invention is not limited to the details disclosed in the drawings and the specification. Accordingly, it is intended that the invention is not limited to the disclosed embodiments, but that it has the full scope permitted by the language of the following claims.

What is claimed is:

1. A press head locking mechanism for locking a press head and a test socket substrate, comprising:
    an actuator disposed on at least one of the press head and the test socket substrate;
    a slider disposed on at least one of the press head and the test socket substrate, the slider being connected to the actuator; and
    a locking pin disposed on at least one of the press head and the test socket substrate;
    wherein, when the press head is engaged with the test socket substrate, the actuator drives the slider to move in a predetermined direction to secure the locking pin, so that the press head and the test socket substrate are securely locked and prevented from being separated from each other.

2. The press head locking mechanism according to claim 1, wherein the actuator and the slider are disposed on the press head, a lower surface of the press head is provided with an insertion hole, the locking pin protrudes from an upper surface of the test socket substrate, the slider has a slot configured to receive the locking pin through the insertion hole when the press head is engaged with the test socket substrate, and the actuator drives the slider to secure the locking pin in the slot.

3. The press head locking mechanism according to claim 2, wherein the slot of the slider comprises a large circular hole and a small circular hole, the slider further comprises a push block, and the locking pin comprises a head portion and a neck portion; when the press head is engaged with the test socket substrate, the head portion of the locking pin extends through the large circular hole, the actuator urges the push block to securely lock the neck portion of the locking pin in the small circular hole of the slider.

4. An electronic device testing apparatus having a press head locking mechanism, comprising:
    a test socket substrate having a test socket slot;
    a press head having a first support arm and a second support arm, the first support arm and the second support arm corresponding to two corresponding sides of the test socket slot; and
    a pair of press head locking mechanisms, each of which is disposed on at least one of the first support arm, the second support arm, and the test socket substrate; each press head locking mechanism comprising an actuator, a slider, and a locking pin;
    wherein, when the press head is engaged with the test socket substrate, the actuator drives the slider to move in a predetermined direction to secure the locking pin, so that the press head and the test socket substrate are securely locked and prevented from being separated from each other.

5. The electronic device testing apparatus according to claim 4, wherein each of the first and second support arms is provided with the actuator and the slider, the locking pin protrudes from an upper surface of the test socket substrate, and corresponds to the first and second support arms.

6. The electronic device testing apparatus according to claim 5, wherein the test socket substrate further comprises a first protrusion and a second protrusion opposite to each other and mounted on the test socket substrate, with the test socket slot being located in between; each of the first protrusion and the second protrusion is provided with the locking pin.

7. The electronic device testing apparatus according to claim 6, wherein each of the first support arm and the second support arm has an insertion hole provided at a lower surface thereof, and the slider has a slot configured to receive the locking pin through the insertion hole when the press head is engaged with the test socket substrate, and the actuator drives the slider to lock the locking pin in the slot.

8. The electronic device testing apparatus according to claim 7, wherein each of the first support arm and second support arm includes an accommodating space in communication with the insertion hole, and a locking part protruding from one side of the accommodating space, the accommodating space is configured to receive the slider, the slider comprises a bottom plate, a push block located on one side of the bottom plate, and a stop block located on the other side of the bottom plate, when the actuator drives the slider such that the stop block is stopped by the locking part, the locking pin is secured by the slider; and when the actuator drives the slider such that the push block is stopped by the locking part, the locking pin is released.

9. The electronic device testing apparatus according to claim 8, wherein the slot of the slider comprises a large circular hole and a small circular hole, the locking pin includes a head portion and a neck portion; when the actuator drives the slider such that the stop block is stopped by the locking part, the neck portion of the locking pin is received and secured in the small circular hole of the slider, and when the actuator drives the slider such that the push block is stopped by the locking part, the locking pin is aligned with the large circular hole of the slider, enabling the head portion of the locking pin to pass through the large circular hole freely.

10. The electronic device testing apparatus according to claim 4, wherein the press head further includes a pressure generating device and a press-fit block, the pressure generating device is located between the first support arm and second support arm, and the press-fit block is disposed on the pressure generating device and opposite to the test socket slot.

* * * * *